(12) United States Patent
Kwak

(10) Patent No.: US 11,799,496 B2
(45) Date of Patent: *Oct. 24, 2023

(54) ERROR CORRECTION BIT FLIPPING SCHEME

(71) Applicant: Micron Technology, Inc., Boise, ID (US)

(72) Inventor: Jongtae Kwak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/726,349

(22) Filed: Apr. 21, 2022

(65) Prior Publication Data

US 2022/0247428 A1 Aug. 4, 2022

Related U.S. Application Data

(60) Continuation of application No. 17/170,259, filed on Feb. 8, 2021, now Pat. No. 11,336,298, which is a division of application No. 16/199,773, filed on Nov. 26, 2018, now Pat. No. 10,951,232.

(51) Int. Cl.
    *G06F 7/02* (2006.01)
    *H03M 13/11* (2006.01)
    *G11C 29/52* (2006.01)
    *G06F 11/10* (2006.01)

(52) U.S. Cl.
    CPC ..... *H03M 13/1108* (2013.01); *G06F 11/1068* (2013.01); *G11C 29/52* (2013.01)

(58) Field of Classification Search
    CPC ............ H03M 13/1108; G06F 11/1068; G06F 11/1032; G06F 11/1048; G06F 11/10; G06F 11/1016; G11C 29/52
    See application file for complete search history.

(56) References Cited

U.S. PATENT DOCUMENTS 10,802,909 B2    10/2020  Fackenthal
10,951,232 B2 *  3/2021   Kwak ............... G06F 11/1068
2013/0272078 A1  10/2013  Nakanishi et al.
(Continued)

FOREIGN PATENT DOCUMENTS

KR    10-2010-0033195 A    3/2010

OTHER PUBLICATIONS

Korean Patent Office, "Request for the Submission of an Opinion", issued in connection with Korean Patent Application No. 10-2021-7018717 dated Sep. 8, 2022 (16 pages).
(Continued)

*Primary Examiner* — Christine T. Tu
(74) *Attorney, Agent, or Firm* — Holland & Hart LLP

(57) ABSTRACT

Methods, systems, and devices for operating a memory device are described. An error correction bit flipping scheme may include methods, systems, and devices for performing error correction of one or more bits (e.g., a flip bit) and for efficiently communicating error correction information. The data bits and the flip bit (e.g., an error corrected flip bit) may be directly transmitted (e.g., to a flip decision component). The flip bit may be transmitted to the flip decision component over a dedicated and/or unidirectional line that is different from one or more other lines that carry data bits (e.g., to the flip decision component).

20 Claims, 10 Drawing Sheets

(56) References Cited

U.S. PATENT DOCUMENTS

| | | |
|---|---|---|
| 2015/0212877 A1 | 7/2015 | Kern et al. |
| 2017/0093439 A1 | 3/2017 | Motwani |
| 2017/0117925 A1 | 4/2017 | Achtenberg et al. |
| 2017/0220414 A1* | 8/2017 | Circello ............ H03M 13/2927 |
| 2017/0261557 A1 | 9/2017 | Fee et al. |
| 2018/0034477 A1 | 2/2018 | Zamir et al. |
| 2018/0131389 A1 | 5/2018 | Xiong et al. |
| 2019/0012229 A1 | 1/2019 | Cha et al. |
| 2019/0158115 A1 | 5/2019 | Kuo |
| 2021/0143836 A1* | 5/2021 | Zhang .................. H04L 1/0051 |
| 2021/0167796 A1 | 6/2021 | Xiong et al. |
| 2021/0326068 A1 | 10/2021 | Li |

OTHER PUBLICATIONS

Definitions of "buffer" and "buffering", Microsoft Press, Computer Dictionary, 2nd Edition, 1994 by Microsoft Press, p. 56. (Year: 1994).

International Search Report and Written Opinion received for PCT Patent Application No. PCT/US19/58141, dated Feb. 14, 2020, 9 pages.

U.S. Appl. No. 16/104,470, entitled "Enhanced Bit Flipping Scheme," filed Aug. 17, 2018 (58 pages).

* cited by examiner

ERROR CORRECTION BIT FLIPPING SCHEME

CROSS REFERENCE

The present Application for Patent is a continuation of U.S. patent application Ser. No. 17/170,259 by Kwak, entitled "ERROR CORRECTION BIT FLIPPING SCHEME," filed Feb. 8, 2021, which is a divisional of U.S. patent application Ser. No. 16/199,773 by Kwak, entitled "ERROR CORRECTION BIT FLIPPING SCHEME," filed Nov. 26, 2018, each of which is assigned to the assignee hereof, and each of which is expressly incorporated by reference in its entirety herein.

BACKGROUND

The following relates generally to operating a memory device, and more specifically to an error correction bit flipping scheme.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device.

A memory device may invert data bits stored at memory cell(s) (e.g., for reliability reasons). A bit may indicate that the logic state stored at the particular memory cell(s) is inverted. Performing error correction for a bit related to inversion, however, may delay other operations and this delay may be compounded by propagation delays, introducing significant latency. Enhanced schemes related to bit flipping and error correction operations are desired.

DETAILED DESCRIPTION

Figure 1:
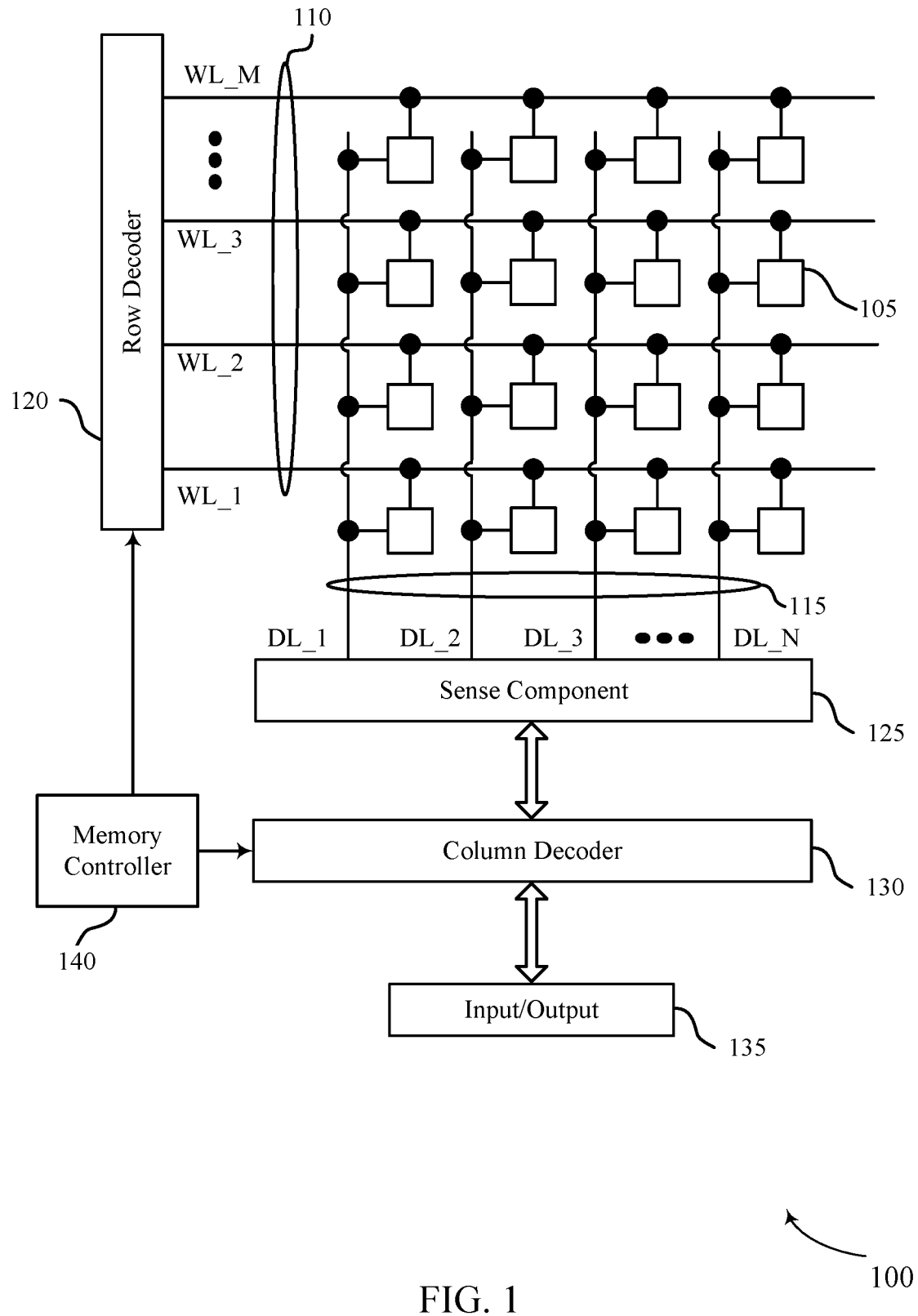
FIG. 1 illustrates an example of a system for operating a memory device that supports an error correction bit flipping scheme in accordance with aspects of the present disclosure.

A memory device may invert data bits stored at memory cell(s) (e.g., for reliability reasons). After inverting one or more data bits for one or more memory cells, the memory device may set an inversion bit to indicate that the logic state stored at the one or more memory cells is inverted. When reading data from memory, the memory device may error correct one or more bits (e.g., data bits, inversion bits) and may determine whether any of the data bits have been inverted (e.g., based on a corresponding error corrected inversion bit). Performing error correction for data bits and inversion bits, however, may delay a read operation and this delay may be compounded by propagation delays based on indirect routing of the bits from one component through another component (e.g., routing error corrected flip bits through the data bit error correction components such that the data bits have to wait for the error corrected flip bit before being transmitted to the data bus inversion component) introducing significant latency into a memory system.

In some examples of this indirect routing, memory applications may employ an inversion bit or a flip bit, and error correction components that may correct different bits, including the data bits and the flip bit. In some examples, the error correction component may correct the flip bit before transmitting other information (e.g., data) to the data bus inversion component, which may be an example of or may include a flip decision component. In this case, this may introduce latency to data access times due to the data having to wait for the flip bit correction and then additionally wait for the error corrected flip bit to propagate to all the data bit error correction components before the data being transmitted.

As disclosed herein, the latency in the memory system may be reduced by transmitting the error corrected flip bit directly to the data bus inversion component or the flip decision component. This may be achieved by transmitting the error corrected flip bit on a dedicated line that transmits information directly from the flip bit error correction component to the flip decision component. The dedicated line may be a read-only line or a unidirectional line which may have a transmission speed that may be faster than bi-directional lines, such as the data bit transmission lines. Because the error corrected flip bit may be transmitted directly to the flip decision component, the error correction data components may not need to receive the error corrected flip bit at the data bit error correction components and the data bits may be transmitted directly to the flip decision component on another line or lines.

In some examples, instead of the memory array data bits waiting for the error corrected flip bit and instead of employing alternative schemes, such as the majority voting scheme, that may in some cases change the physical size of the component, the data bus inversion component or the flip decision component (e.g., which may be located at the global data bus) may be used for determining whether the data bits have been inverted and invert the data bits as appropriate. In some examples, the flip decision component and the data bus inversion component may be or be included within the same component.

In some examples, by using the flip decision component, as soon as the error correction component corrects any single data bit, including the flip bit, data may be transmitted through the data bus without having to wait to receive the error corrected flip bit at the data bit error correction component. The data bits (e.g., which may be error corrected in some cases) and the error corrected flip bit may be directly transmitted through to the flip decision component so that the data bits may not have to wait for the error corrected flip bit before being transmitted to the flip decision component. The flip decision component may then determine whether the data has been inverted and then invert the data as appropriate based on receiving the error corrected flip bit directly from the flip bit error correction component and the data bits from the data bit error correction component.

Features of the disclosure introduced above are further described herein in the context of a memory system. Specific examples of devices and methods for error correcting according to an error correction bit flipping scheme are described. These and other features of the disclosure are further illustrated by and described with reference to apparatus diagrams, system diagrams, and flowcharts that relate to an enhanced error correction bit flipping scheme.

FIG. 1 illustrates an example memory array that supports an error correction bit flipping scheme in accordance with various embodiments of the present disclosure. Memory array 100 may be used to store digital information (e.g., binary information) and may also be referred to as an electronic memory apparatus. Memory array 100 includes memory cells 105 that are programmable to store different states. Each memory cell 105 may be programmable to store two states, denoted as a logic 0 and a logic 1. In some cases, memory cell 105 is configured to store more than two logic states.

A memory cell 105 may include a memory element having programmable states. A memory cell 105 in a DRAM or FeRAM architecture may store a charge representative of the programmable states in a capacitor; for example, a charged and uncharged capacitor may represent two logic states, respectively. DRAM architectures may commonly use such a design and may use a capacitor including a dielectric material and having linear electric polarization properties as a memory element. FeRAM architectures may also use such a design, but the capacitor used as the memory element may include a ferroelectric material with non-linear polarization properties. A memory cell 105 in a PCM or segregation based memory (SBM) architecture may change a resistivity (e.g., resistance or threshold voltage) of a material where different resistivity may represent different logic states. PCM and/or SBM architectures may use chalcogenide materials having electronically programmable resistances as memory elements. In some cases, a memory cell 105 in a PCM architecture is programmed by changing a phase of a memory material. In some cases, a memory cell 105 in an SBM architecture is programmed by causing ion movement within a memory material.

Operations such as reading and writing may be performed on memory cells 105 by activating or selecting the appropriate access line 110 and digit line 115. Access lines 110 may also be referred to as word lines 110 and digit lines 115 may also be referred to as bit lines 115. Activating or selecting a word line 110 or a digit line 115 may include applying a voltage to the respective line. Word lines 110 and digit lines 115 are made of conductive materials. For example, word lines 110 and digit lines 115 may be made of metals (such as copper, aluminum, gold, tungsten, etc.), metal alloys, other conductive materials, or the like. According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell.

In some architectures, the logic storing device of a cell (e.g., a capacitor) may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105.

Accessing memory cells 105 may be controlled through a row decoder 120 and a column decoder 130. In some examples, a row decoder 120 receives a row address from the memory controller 140 and activates the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_3 and DL_N, the memory cell 105 at their intersection may be accessed.

Upon accessing, a memory cell 105 may be read, or sensed, by sense component 125 to determine the stored state of the memory cell 105. For example, after accessing the memory cell 105, the capacitor of memory cell 105 may discharge onto its corresponding digit line 115. Discharging the capacitor may be based on biasing, or applying a voltage, to the capacitor. The discharging may induce a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa.

The reliability of a sensing operation may be dependent on a sensing window that results from reading the memory cell 105. For instance, a larger sensing window may be associated with fewer bit errors than a smaller sensing window. The sensing window may be determined as the difference between a voltage of a digit line 115 resulting from reading a memory cell 105 when storing a logic 1 and the voltage of the digit line 115 resulting from reading the memory cell when storing a logic 0. Sense component 125 may include various transistors or amplifiers in order to detect and amplify a difference in the signals, which may be referred to as latching. The detected logic state of memory cell 105 may then be output through column decoder 130 as output 135.

A memory cell 105 may be set, or written, by activating the relevant word line 110 and digit line 115. As discussed herein, activating a word line 110 electrically connects the corresponding row of memory cells 105 to their respective digit lines 115. By controlling the relevant digit line 115 while the word line 110 is activated, a memory cell 105 may be written—e.g., a logic value may be stored in the memory cell 105. Column decoder 130 may accept data, for example input 135, to be written to the memory cells 105.

The memory controller 140 may control the operation (e.g., read, write, re-write, refresh, etc.) of memory cells 105 through the various components, such as row decoder 120, column decoder 130, and sense component 125. Memory controller 140 may generate row and column address signals in order to activate the desired word line 110 and digit line 115. Memory controller 140 may also generate and control various voltage potentials used during the operation of memory array 100. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

In some cases, memory array 100 may flip a logic state of a memory cell 105—e.g., change a logic value stored in memory cell 105 from one value (e.g., logic 1) to another logic value (logic 0). Memory array 100 may perform the flipping internally and may not inform other external devices or components that the logic state of a memory cell has been flipped. Memory array 100 may flip memory cells to save power, to increase the reliability of a device, or the like. For example, for FeRAM, ferroelectric memory cells may be flipped to mitigate the effects of imprinting—e.g., the drifting of ferroelectric domains due to extended exposure to or storage of the same charge—which may reduce the reliability of the memory cell over time. A memory cell 105 storing a logic state that is different than the original logic state— e.g., the logic state expected to be stored at the memory cell by external devices or components—may be referred to as being in an inverted state. The bit that indicates whether or not the data has been inverted may be referred to herein as a flip bit.

A device (e.g., a host device, a controller) may issue an access command for data. Certain information (e.g., data bits, parity bits, flip bit) may be error corrected before transmitting the information or data back to the host device. The data bits, the parity bits, and the flip bit may be received at an error correction component for error correction to facilitate this error correction. Additionally, the determination may be made whether the data has been inverted. In some examples, the determination whether the data has been inverted may be achieved by reviewing the data bits, using logic components, that detect whether the data includes more than four 1s.

During error correction, error information may be received from a decoder by an error correction component, which may include one or more error correction components to correct one or more errors such as those related to data and/or flip bits. In some cases, the flip bit may have an error correction component and each bit of the sets of data bits and parity bits may have a corresponding error correction component. In some cases, the flip bit may be error corrected, and the error corrected flip bit may be transmitted to a flip decision component. The error corrected flip bit may be transmitted directly to the flip decision component, which may in some cases be transmitted on a dedicated, unidirectional line. In some cases, one or more data bits may additionally or alternatively be error corrected. As soon as the flip bit is error corrected, the data bits (which may or may not have been error corrected previously) may be transmitted directly to the flip decision component over a second line (e.g., that is different from the first line that the error corrected flip bit is transmitted on. The flip decision component may determine whether the data bits have been inverted based on receiving the error corrected flip bit and/or one or more data bits, and if so, may invert the data bits.

Figure 2:
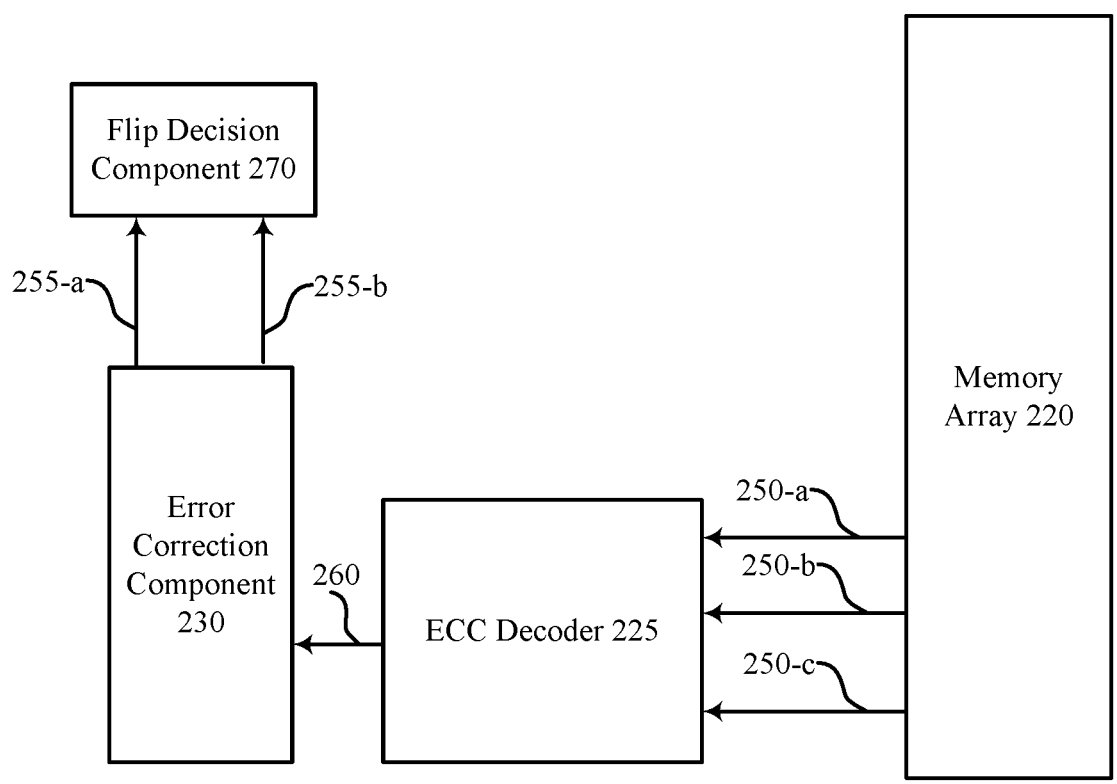
FIG. 2 illustrates an example of an apparatus that supports an error correction bit flipping scheme in accordance with aspects of the present disclosure.

FIG. 2 illustrates an example of an apparatus 200 that supports an error correction bit flipping scheme in accordance with aspects of the present disclosure. In some examples, apparatus 200 may include one or more components described herein with reference to FIG. 1. For example, apparatus 200 may include an error correction component 230 as described with reference to FIG. 2 and may include a decoder 205 and a flip decision component 270.

In some examples, one or more data bits, one or more parity bits, and one or more flip bits may be received (e.g., from memory array 220) on lines 250-a, 250-b and 250-c. In some examples, a memory controller (e.g., memory controller 140 as described with reference to FIG. 1) may initiate the transmission of the one or more data bits, the one or more parity bits, and/or one or more flip bits from the memory array 220. In some examples, the memory controller 140 may be a local memory controller, an external memory controller, or a host device controller. Upon being transmitted from memory array 220, the one or more data bits, the one or more parity bits, and/or one or more flip bits may be received by ECC decoder 225 on lines 250-a, 250-b, and 250-c. The lines 250-a, 250-b, and 250-c may be lines that carry a flip bit, data bits, and parity bits, respectively.

The ECC decoder 225 may, in some examples, may be, may include, or may be coupled with a binary decoder (not shown) that may function to locate one or more errors in one or more bits. In some examples, the ECC decoder 225 may decode the one or more data bits, the one or more parity bits, and/or one or more flip bits to determine an error associated with the one or more data bits, the one or more parity bits, and/or one or more flip bits. The ECC decoder 225 may then, in some examples, transmit one or more bits (e.g., the one or more data bits, the one or more parity bits, and/or one or more flip bits) which may include decoded data, to error correction component 230 (e.g., one or more error correction components) on line 260. In some examples, the ECC decoder 225 may transmit the indication of one or more bits (e.g., the one or more data bits, the one or more parity bits, and/or one or more flip bits) which may include decoded data, to error correction component 230 (e.g., one or more error correction components) on line 260.

In some examples, error correction component 230 may transmit the error corrected data directly to the flip decision component 270. In some examples, an error corrected flip bit may be transmitted directly to the flip decision component 270 on line 255-a. This may, for example, be performed on a dedicated line 255-a between the error correction component 230 and the flip decision component 270 (e.g., without transmitting the error corrected flip bit to the data bit error correction component as previously discussed). This may, for example, be performed on a unidirectional line 255-*a* between the error correction component 230 and the flip decision component 270.

In some examples, error correction component 230 may transmit data bits directly to the flip decision component 270 on line 255-*b*. Transmitting the data bits may be based on processing the flip bit or transmitting the processed flip bit to the flip decision component, or transmitting the processed flip bit directly to the flip decision component over a flip bit line, or any combination thereof. Although line 255-*b* is indicated as a single line in FIG. 2, this is for explanatory purposes only and not of limitation because other alternatives are also contemplated. In some examples, line 255-*b* may be multiple lines for transmitting the data bits from multiple error correction component to the flip decision component. The line 255-*b* of FIG. 2 may be a separate line than the flip bit transmission line 255-*a*. Additionally, the line 255-*b* may be a read/write line or a bi-directional line. After the flip decision component 270 receives the data bits and the error corrected flip bit, the flip decision component may determine whether the data bits have been inverted.

In some examples, error correction component 230 may determine one or more errors associated with a data bit of the plurality of data bits and correct the error associated with the data bit. The error may be corrected based in part on determining the error at ECC decoder 225. In some examples, the error correction component 230 may determine that the data bits may not be error corrected.

Figure 3:
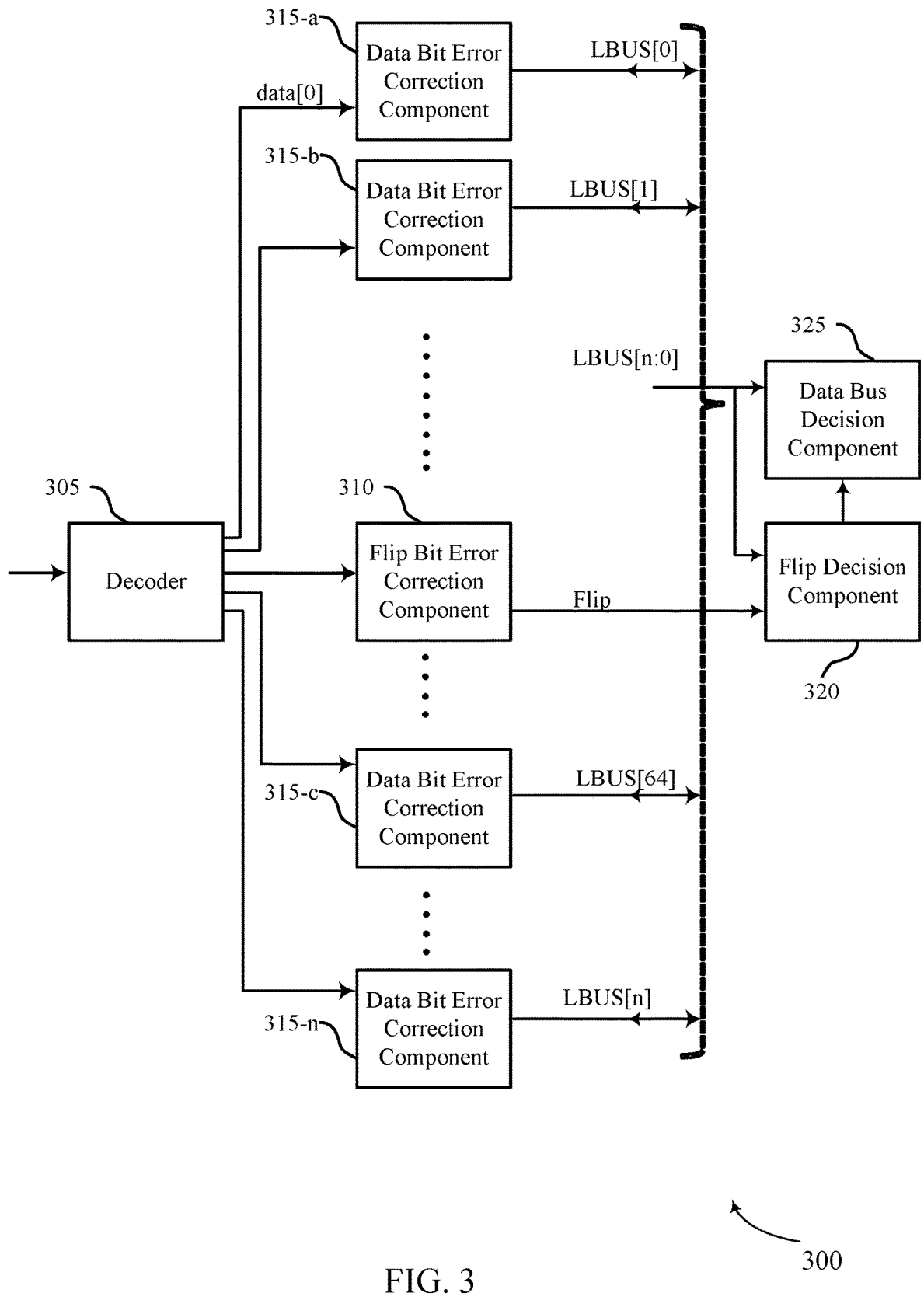
FIG. 3 illustrates an example of an apparatus that supports an error correction bit flipping scheme in accordance with aspects of the present disclosure.

FIG. 3 illustrates an example of an apparatus 300 that supports an error correction bit flipping scheme in accordance with aspects of the present disclosure. In some examples, apparatus 300 may include one or more components described herein with reference to FIGS. 1 and/or 2. For example, apparatus 300 may include an error correction component as described with reference to FIG. 2. The apparatus 300 may include a decoder 305, a flip bit error correction component 310, one or more data bit error correction components 315-*a*, 315-*b* . . . 315-*n*, flip decision component 320, and the data bus decision component 325. In some examples, the flip decision component 320 may be a data bus inversion component. In some examples, the flip decision component 320 may include the logic components of the data bus decision component 325 such that the flip decision component 320 and the data bus decision component 325 may be the same component.

In FIG. 3, apparatus 300 may include a decoder 305 which may be one or more components. In some examples, the decoder 305 may be or include an ECC decoder coupled with a binary decoder. In some cases, the decoder 305 may be able to locate errors in information that is decoded by decoder 305 (e.g., may serve as an error locator). The decoder 305 may receive information (e.g., at an ECC decoder) including one or more data bits, one or more parity bits, and/or one or more flip bits. Although other correction components, such as a parity bit error correction component, are not illustrated, these other components may perform similar functions to the data bit and flip bit error correction components as discussed herein. Although one or more flip bits may be received at the decoder, processed, and transmitted (e.g., through to the flip bit error correction component), for discussion purposes only, a single flip bit will be discussed herein.

The information received at the ECC decoder may be processed and then transmitted to the binary decoder, which may determine a location of one or more errors (e.g., in one or more data bits, one or more parity bits, and/or one or more flip bits).

After locating the one or more errors in the received bits, the decoder 305 may transmit one or more data bits, one or more parity bits, and/or one or more flip bits to a respective bit error correction component. In this example, the decoder 305 may locate an error in one or more bits (e.g., in data[0]). The decoder 305 may then transmit this error location to the data bit error correction component 315-*a*. Although only four data bit error correction components 315 are illustrated in FIG. 3, there may be a corresponding data bit error correction component for each set of data bits as appropriate.

The flip bit error correction component 310 may receive an indication (e.g., from the decoder 305) of whether or not the flip bit should be corrected. In some examples, the flip bit error correction component 310 may receive an indication that the flip bit may be corrected and the flip bit error correction component 310 may correct the flip bit based on receiving the indication. The flip bit error correction component 310 may then transmit the flip bit directly to the flip decision component 320.

In some examples, by transmitting the error corrected flip bit directly to the flip decision component 320, the memory system may circumvent aspects that may be included in other error correction schemes such as increasing the physical size of the component (and using extra memory array data bits), or introducing latency into the memory system by requiring the data error correction component to wait for the error corrected flip bits before being transmitted to the flip decision component 320.

In some examples, the flip bits may be transmitted directly to the flip decision component 320 on a line, which may be a dedicated line that couples the flip bit error correction component 310 with the flip decision component 320. The flip bit line may be a read only and unidirectional line in some cases. Because the flip bit line may be read only and unidirectional, data transmission on the flip bit line may faster than on a read/write, bidirectional line. In some examples, because the flip bit line may have a faster data transmission speed and/or other advantageous features, the transmitted error corrected flip bit may be advantageously received by the flip decision component 320 before the data bits are received. Because the error corrected flip bit may be transmitted on a separate line from the data bit, the data bit components may not have to wait to receive the error correct flip bit at the error correction component before transmission to the flip decision component 320, thus reducing latency, among other advantages.

In some examples, the error corrected flip bit may be received by the flip decision component 320 concurrent with or simultaneously with at least one of the data bits. The flip decision component 320 may be configured to determine whether the received data bits may have been inverted based on receiving at least a subset of the data bits, or the flip decision component 320 may be configured to wait until all the data bits have been received and then make the determination whether the data bits have been inverted.

Similarly, additionally or alternatively indicated errors in the data bits may be corrected (e.g., at the data bit error correction component 315), and the corrected data bits may then be transmitted directly to the flip decision component 320 and also to the data bus decision component 325. In some examples, the data bits may be transmitted directly to the flip decision component 320 and on a separate line from the error corrected flip bits. Because the error corrected flip bit may be transmitted on a separate line from the data bit, the data bits may not have to wait to receive the error corrected flip bit at the error correction component before transmission to the flip decision component 320. In some examples, the at least some of the data bits may be received at the flip decision component 320 after receiving the flip bit.

The flip decision component 320 may determine whether one or more data bits and/or one or more flip bits have been inverted. In some examples, the flip decision component 320 may receive the flip bit directly from the flip bit error correction component 310 (e.g., over a dedicated flip bit line). The data bits may be transmitted from the data bit error correction components 315-a, 315-b . . . 315-n, via the respective local buses and may be received at both the flip decision component 320 and the data bus decision component 325, which are describe with reference to other figures herein. In some examples, the flip decision component 320 may determine an output value using a configured logic criterion based on receiving the data bits and the error corrected flip bit.

In some examples, after locating one or more errors, the decoder 305 may transmit one or more data bits, one or more parity bits, and/or one or more flip bits to the respective error correction components. In some examples, the decoder 305 may locate one or more errors, if any, in the received data bits and transmit this information to the respective data bit error correction component. In this example, the decoder 305 may locate an error in one or more bits (e.g., in data[0]). The decoder 305 may then transmit this error location to the data bit error correction component 315-a. Although only four data bit error correction components 315 are illustrated in FIG. 3, there may be a corresponding data bit error correction component for each set of data bits as appropriate.

Figure 4:
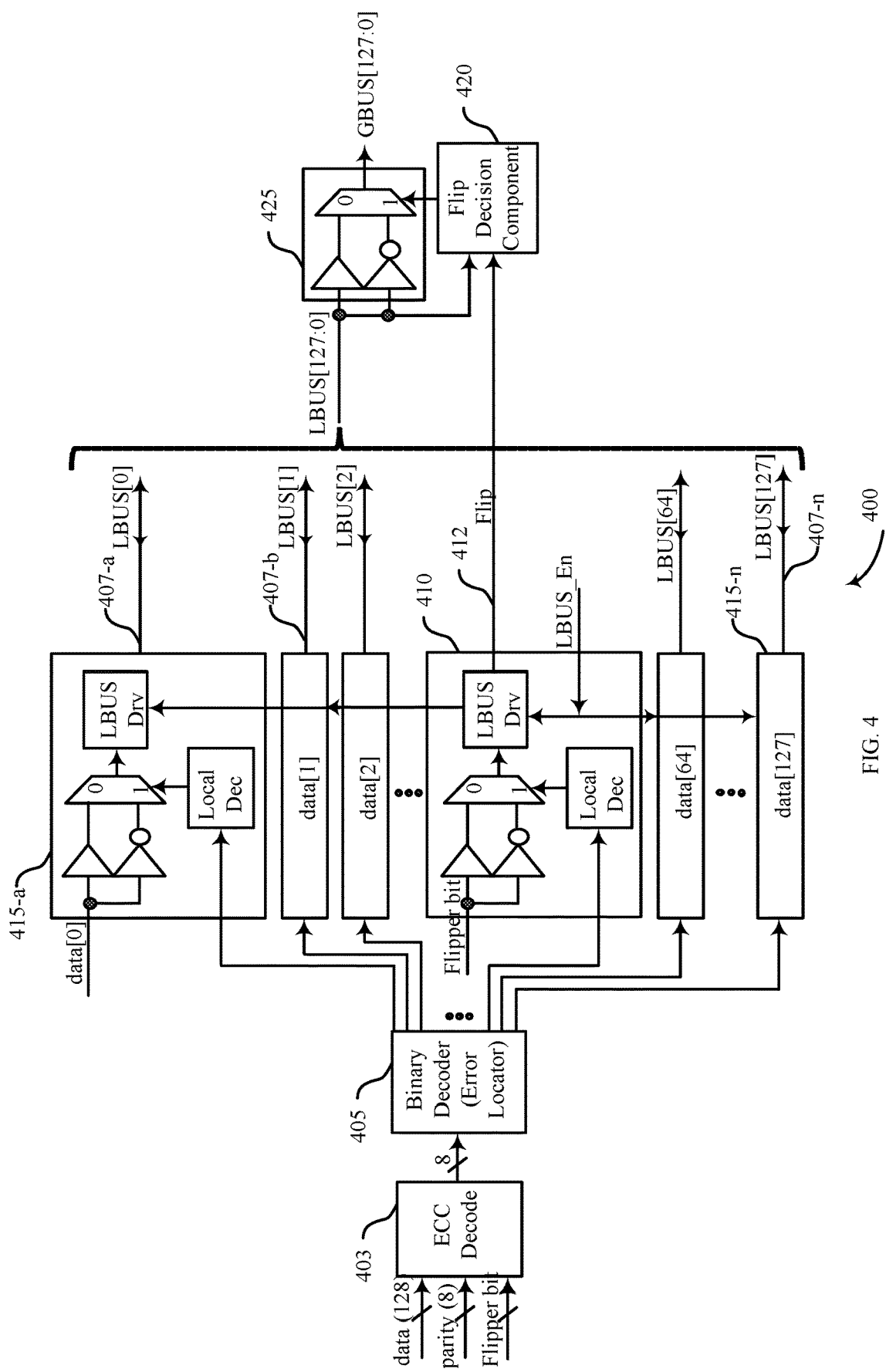
FIG. 4 illustrates an example of an apparatus that supports an error correction bit flipping scheme in accordance with aspects of the present disclosure.

FIG. 4 illustrates an example of an apparatus 400 that supports an error correction bit flipping scheme in accordance with aspects of the present disclosure. In some examples, apparatus 400 may include one or more components described herein with reference to FIGS. 1-3. For example, apparatus 400 may include an error correction component as described with reference to FIGS. 2 and 3. The apparatus 400 may include a decoder 405, a flip bit error correction component 410, data bit error correction components 415-a, 415-b . . . 415-n, flip decision component 420, and the data bus decision component 425.

In FIG. 4, the ECC decoder 403 may receive one or more data bits, one or more parity bits, and one or more flip bits, and the ECC decoder 403 may be coupled with the binary decoder 405 in some cases. The ECC decoder 403 may, in some examples, decode the plurality of data bits and the plurality of parity bits. The decoding process related to ECC decoder 403 may facilitate the determination of an error associated with at least one of the one or more data bits, one or more parity bits, and one or more flip bits.

In some examples, the ECC decoder 403 may transmit the one or more data bits, one or more parity bits, and one or more flip bits to the binary decoder 405. In some examples, the binary decoder 405 may transmit the error information to each corresponding error correction component. In some examples, the binary decoder 405 may determine error information regarding the plurality of data bits. The binary decoder 405 may transmit the error information for the plurality of data bits to each of the corresponding data bit error correction components 415-a, 415-b . . . 415-n. In some examples, the binary decoder may determine error information about at least one flip bit and transmit error information (e.g., an indication of an error and/or an error location) to the flip bit error correction component 410. In some examples, the binary decoder 405 may determine error information about at least one of a plurality of parity bits and may transmit error information (e.g., an indication of an error and/or an error location) to a parity bit error correction component (not shown in FIG. 4), which may be similar to data bit error correction components 415-a, 415-b . . . 415-n and/or flip bit error correction component 410.

In some examples, the binary decoder 405 may transmit the error information for a first set of data bits on a data line, data[0], to the data bit error correction component 415. The data bits may then be transmitted on local bus 407-a, LBUS[0], to the flip decision component 420 via the data bus decision component 425. The data bits may be transmitted without having to wait for a trigger such as receiving an error corrected flip bit. The data bits may be transmitted as soon as any error correcting component corrects any single bit error whether it is a data bit or a flip bit that may be error corrected.

In some examples, the data bits may be transmitted from the error correction component 415-a to the flip decision component 420 and the data bus decision component 425 on line 407-a, via a local bus, LBUS[0]. Each data bit error correction component may transmit the data bits via the corresponding local bus, LBUS[n]. Additionally, all of the local bus lines 407-a, 407-b . . . 407-n may be transmitted on one or more general local bus lines, LBUS[127:0], in which the one or more general local bus lines, LBUS[127:0], may be the input line to the flip decision component 420 and the data bus decision component 425. Although only one of the general local bus lines, LBUS[127:0] is depicted in FIG. 4, more than one general local bus may be employed to transmit data bits from the error correction components to the flip decision component 420 and the data bus decision component 425.

In some examples, the data bus decision component 425 may receive the data bits as inputs. By passing the data bits through a non-inverting logic component and an inverting logic component, one or more operations may be performed (e.g., the value of the data bits may be refreshed). The outputs of the non-inverting and inverting logic component may then be passed to a multiplexer. The multiplexer may receive the data bits from the non-inverting and inverting logic components as well as the output value from the flip decision component. The output value from the flip decision component 420 may be an indicator of whether or not the data bits may be inverted at the multiplexer. These inputs may be multiplexed together to produce the correct data for output to one or more global bus lines, GBUS[127:0]. In some examples, the multiplexer of the data bus decision component 425 may be coupled with one or more global data bus lines GBUS[127:0].

In some examples, the error correction components 415-a, 415-b . . . 415-n, and 410 may correct an error associated with at least one of a plurality of bits. The errors may be corrected, in some examples, based in part on determining the error at the binary decoder 405 or in response to the decoding process that occurred at ECC decoder 403, among other cases.

In some examples, the flip bit may be processed or error corrected at the flip bit error correction component 410. Based on the information received from the binary decoder 405 and in some cases, one or more operations performed at the flip bit error correction component 410 (e.g., such as a determination), the flip bit may be processed (e.g., processing a flip bit may include correcting the flip bit or not correcting the flip bit and passing the flip bit through the error correction component) or corrected and then may be transmitted directly to the flip decision component 420 on a flip bit line 412. By transmitting the processed or error corrected flip bit directly to the flip decision component 420, the data bits may not have to wait to receive the error corrected flip bit before being transmitted to the flip decision component 420. Because the data bits may be transmitted directly to the flip decision component 420 and on a separate line than the error corrected flip bit, the memory system may operate faster and more efficiently due to the reduced transmission time. Further, due to the error corrected flip bit being received on a faster and unidirectional line at the flip decision component 420, the decision at the flip decision component 420 may take place as soon as at least some the data bits are received at the flip decision component 420.

In some examples, the flip bit line 412 may be a line (e.g., a dedicated line) that couples the flip bit error correction component 410 with the flip decision component 420. The flip bit line 412 may be a unidirectional line in some cases. Additionally or alternatively, the data bit lines 407-a, 407-b . . . 407-n may be bi-directional lines. In some examples, the flip bit line 412 may have a lower capacitive load than the data bit lines 407-a, 407-b . . . 407-n. Additionally, the flip bit line 412 may be configured as a read only line and the data bit lines may be configured as read/write lines. Further, in some cases, the flip bit line 412 may be configured with a transmission speed faster than the data bit lines 407-a, 407-b . . . 407-n. In some examples, because the flip bit line 412 may have a faster data transmission speed and/or other advantageous features, the transmitted error corrected flip bit may be advantageously received by the flip decision component 420 before the data bits (e.g., which may have been error corrected) are received. Because the error corrected flip bit may be transmitted on a separate line from the data bit, the data bits may not have to wait to receive the error corrected flip bit at the error correction component before transmission to the flip decision component 320, thus reducing latency in the memory system.

In some examples, the error corrected flip bit may be received by the flip decision component 420 concurrent with or simultaneously with at least one of the data bits. The flip decision component 420 may be configured to determine whether the received data bits may have been inverted based on receiving a subset of the data bits, or the flip decision component 420 may be configured to wait until all the data bits have been received and then make the determination whether the data bits have been inverted.

Figure 5:
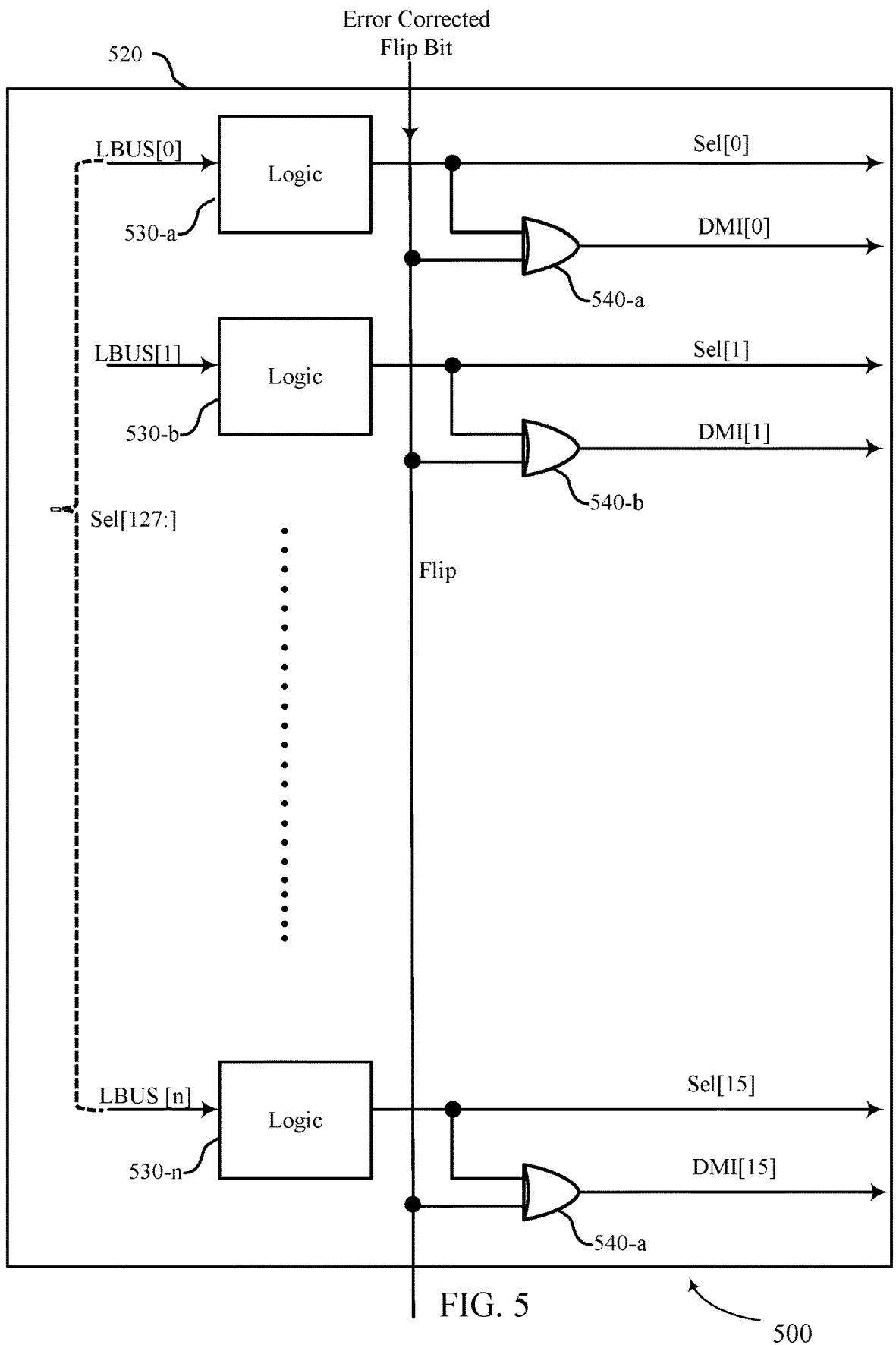
FIG. 5 illustrates an example of an apparatus that supports an error correction bit flipping scheme in accordance with aspects of the present disclosure.

FIG. 5 illustrates an example of an apparatus 500 that supports an error correction bit flipping scheme in accordance with aspects of the present disclosure. In some examples, apparatus 500 may include one or more components described herein with reference to FIGS. 2, 3, and 4. The apparatus 500 may, in some examples, include the components of a flip decision component 520, similar to the flip decision component 420 of FIG. 4, and the flip decision component 320 of FIG. 3.

FIG. 5 illustrates an example of the components of a flip decision component 520. As previously discussed with respect to FIG. 4, the data bits (e.g., which may in some cases be error corrected) may be received at a flip decision component 420. As shown in FIG. 5, one of the individual data bits may be received at a corresponding individual logic component 530-a, 530-b, . . . 530-n. The logic component (e.g., logic component 530-a) may determine an output of the data bits based on one or more operations (e.g., determinations, comparisons) performed. In some examples, the output of the flip decision component 520 may be an indicator of whether or not to invert the flip bits at the multiplexer of the data bus decision component 425 as discussed with reference to FIG. 4.

In some examples, the flip decision component 520 may use the configured logic criterion to determine whether the received data bits should be inverted. In some examples, the configured logic criterion may be stored in the flip decision component 520.

In some examples, this may be achieved by determining whether the received data bits may include greater than four 1s. The example threshold here, four 1s, may be used because the configured logic criterion used in the flip decision component 520 may be a byte based evaluation. Since there are eight bits in a byte, after looking at half the data bits, or four bits, the flip decision component 520 may make a decision about inverting the data bits. This is merely one example and other techniques and alternatives are specifically contemplated. In some examples, the flip decision component 520 may evaluate the received data bits and determine whether there may be less than or equal to four bits of each byte being a certain logical value (e.g., a one value or a zero value) and determine whether to invert the received data bits or not. In some examples, the configured logic criterion may include the decision of whether the received data bits may include greater than four 0s. Although the data bits may be evaluated to determine whether there are greater than four 1s, any number or value may be used. In some examples, the data bits may be evaluated to determine whether there are greater than five 1s, five 0s, six 1s, six 0s, seven 1s, seven 0s, and so forth. Using four 1s in this example, may ensure low power consumption when processing the data bits at the flip decision component 520 since the lower number of data bits that may be evaluated, the less power may be consumed. Generally, the determination may be based on any set of configured logic criterion internal or external to the logic component.

In some examples, the determination may be made that over half the data bits should be inverted at the flip decision component 520. However, inverting the data bits at the flip decision component 520 may consume too much power, so the indicator that the data bits should be inverted may be sent to the multiplexer of the data bus decision component for inverting, to reduce power consumption of the memory device.

The output of the logic components 530 (e.g., logic components 530-a, 530-b . . . 530-n) may be transmitted to other logic components 540 (e.g., logic components 540-a, 540-b . . . 540-n), which may in some cases include an XOR component. Although only three logic components 530 and three logic components 540 are illustrated, there may be a corresponding logic component 540 and corresponding logic component 530 for each of the sets of received data bits that correspond to the one or more data error correction components (e.g., 415-a through 415-n).

Additionally, the error corrected flip bit may be received at the flip decision component 520. The error corrected flip bit may, in some examples, be an input to the XOR component 540. The output of the XOR component 540 may provide an output value that may be transmitted to the data bus decision component (not shown), as discussed with respect to FIGS. 3 and 4. Any appropriate logic may be used to achieve a similar logical output as the XOR component 540, for example, the data bits may be first inverted and then input to an XNOR component to yield a similar result, among other implementations.

In some examples, the flip decision component 520 may determine whether the data bits have been inverted. The logic component 530 may output the decision that the received data bits may include a number of bits having a given logic state (e.g., greater than four is being present). The output value from the flip decision component 520 may be transmitted to the data bus decision component (not shown in FIG. 5) and the output value may be an indicator of whether or not the data bits may be inverted at the multiplexer. These inputs may be multiplexed together to produce the correct data for output to the global bus, GBUS[127:0].

The flip decision component 520 may include any appropriate logic components or configured logic criterion that may determine whether or not the received data bits should be inverted. In one example, the flip decision component 520 may include logic or configured logic criterion that analyzes whether the data bits have greater than four 1s to determine whether the data bits should be inverted. Although any number of logic schemes may be used to determine the data inversion, a logic scheme which consumes less power when processing the data bits may be desirable. In some examples, the flip decision component 520 may compare the received data bits to the configured logic criterion to determine that a number of logic states of the received data bits satisfies a threshold. The flip decision component may then output an indication that the number of logic states of the received data bits satisfies the threshold. The configured logic criterion will be discussed in further detail herein.

As a first example, in the case that the received data bits include less than or equal to four 1s, and the flip bit value is a 0, the decision may indicate that the data bits have not been inverted and the flip decision component 520 may transmit an indication to the data bus decision component to not invert the data bits. As a second example, in the case that the logic component 530 may output the decision that the received data bits may include less than or equal to four 1s, and the flip bit value is a 1, the decision may indicate that the data bits have been inverted and that the flip decision component 520 may transmit an indication to the data bus decision component to invert the data bits. As a third example, in the case, the logic component 530 may output the decision that the received data bits may include greater than four 1s, and the flip bit value is a 0, the decision may indicate that the data bits have been inverted. Accordingly, the flip decision component 520 may transmit an indication to the data bus decision component to invert the data bits. As a fourth example, in the case, the logic component 530 may output the decision that the received data bits may include greater than four 1s, and the flip bit value is a 1, the decision may indicate that the data bits have not been inverted and that the flip decision component 520 may transmit an indication to the data bus decision component to not invert the data bits. In comparing the data bits to the logic components of the flip decision component 520, a determination may be made whether the data bits should be inverted. Once the determination is made at the flip decision component 520, the indication of the decision may be transmitted to the data bus decision component (not shown in FIG. 5) for inverting.

Figure 6:
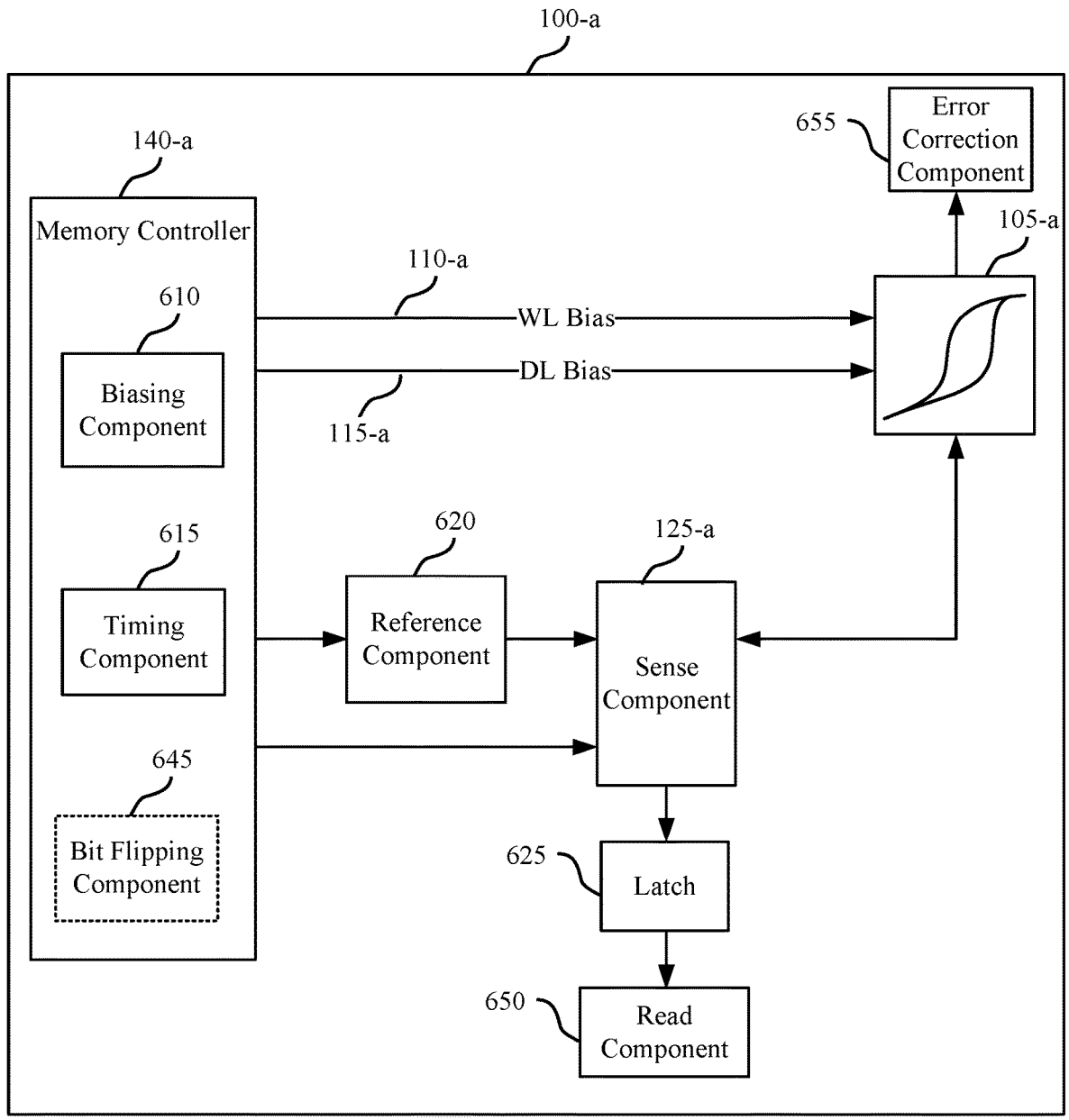
FIG. 6 illustrates an example of a block diagram of devices that supports an error correction bit flipping scheme in accordance with aspects of the present disclosure.

FIG. 6 illustrates a block diagram of a memory array that supports an error correction bit flipping scheme in accordance with various embodiments of the present disclosure. Block diagram 600 may include memory array 100-*a*, which may be an example of a memory array 100 as discussed with reference to FIG. 1. Memory array 100-*a* may be referred to as an electronic memory apparatus and may include memory controller 140-*a*, word line 110-*a*, bit line 115-*a*, sense component 125-*a*, and memory cell(s) 105-*a*, which may be examples of a memory controller 140, word line 110, bit line 115, sense component 125, and memory cell(s) 105 described with reference to FIG. 1. Memory array 100-*a* may also include reference component 620, latch 625, and read component 650. The components of memory array 100-*a* may be in electronic communication with each other and may perform the functions described with reference to FIGS. 1-5.

Memory controller 140-*a* may, in combination with other components apply voltages throughout memory array 100-*a*, write data to memory cells 105-*a*, read data from memory cells 105-*a*, and generally operate memory array 100-*a* as described in FIGS. 1-5. Memory controller 140-*a* may include biasing component 610 and timing component 615. In some cases, memory controller may include bit flipping component 645. Memory controller 140-*a* may be in electronic communication with memory cell(s) 105-*a*, sense component 125-*a*, and reference component 620.

Biasing component 610 may be configured (e.g., by memory controller 140-*a*) to activate word line 110-*a* or bit line 115-*a* by applying voltages to those various nodes. For example, biasing component 610 may be configured to apply a voltage to read or write memory cell 105-*a* as described herein. In some cases, memory controller 140-*a* may include a row decoder, column decoder, or both, as described with reference to FIG. 1. This may enable memory controller 140-*a* to access one or more memory cells 105. Biasing component 810 may also provide voltage potentials to reference component 620 in order to generate a reference signal for sense component 125-*a*. Additionally, biasing component 610 may provide voltage potentials for the operation of sense component 125-*a*.

Timing component 615 may be configured to control the timing of the various word line selections or plate biasing, including timing for switching and voltage application to perform the memory functions, such as reading and writing, discussed herein. In some cases, timing component 615 may control the operations of biasing component 610.

Reference component 620 may include various components to generate a reference signal for sense component 125-*a*. Reference component 620 may include circuitry configured to produce a reference signal.

Sense component 125-*a* may compare a signal from memory cell(s) 105-*a* with a reference signal from reference component 620. Upon determining the logic state, the sense component may then store the output in latch 625, where it may be used in accordance with the operations of an electronic device that memory array 100-*a* is a part. In some cases, reference component 620, sense component 125-*a*, and latch 825 may be components of memory controller 140-*a*.

Bit flipping component 645 may be used to manage aspects of an error correction bit flipping scheme. For instance, bit flipping component 645 may be used to provide timing information to biasing component 610 and/or timing component 615 for a bit flipping operation. Bit flipping component 645 may also include a flip bit generation component and/or a bit flipping component.

Read component 650 may be used to process information bits stored at latch 625. Read component 650 may include aspects of apparatus 200 as discussed with reference to FIG. 2.

Error correction component 655 may receive a flip bit and data bits from the memory cell 105-*a*, for example, after a read command may be transmitted from the memory controller 140-*a* and received at the memory cell 105-*a*. In some examples, there may be a plurality of error correction components that may each correspond to at least a subset of the data bits and/or the flip bit. Although a single flip bit may be discussed in this example, this is for explanatory purposes as multiple flip bits may be received at error correction component 655. In some examples, the error correction component 655 may error correct the received flip bit and data bits. After error correcting the flip bit, the error corrected flip bit may be transmitted directly to a flip decision component (not shown). The error corrected flip bit may be transmitted on a dedicated, unidirectional, and/or read-only line to the flip decision component, in some cases. Further, the error corrected data bits may also be transmitted to the flip decision component. The error corrected data bits may be transmitted on a different line than the error corrected flip bit, which may have a slower transmission speed than the flip bit line since the data bit line may be a read/write line. As such, the error corrected data bits may arrive concurrently with or after the flip bit at the flip decision component. After receiving the error corrected flip bit and error corrected data bits, the flip decision component may determine whether the error corrected data bits may be inverted or not In some examples, the bit flipping component 645 may invert data bits received at the memory array 100-*a*. The inverted data bits may be stored at the memory array 100-*a* and in the event of a command (e.g., a read command) from the host device, (or controller, etc.), the memory array 100-*a* may invert the data bits. The inverted data bits may include an inversion bit or a flip bit that may indicate that the data bits have been inverted.

In some examples, the data bits, flip bit, and parity bits may be first provided from the memory array 100-*a*, to a decoder, to the error correction components, and then to a flip decision component which may determine whether the data bits should be inverted or not, as previously discussed with respect to the error correction component 655.

Figure 7:
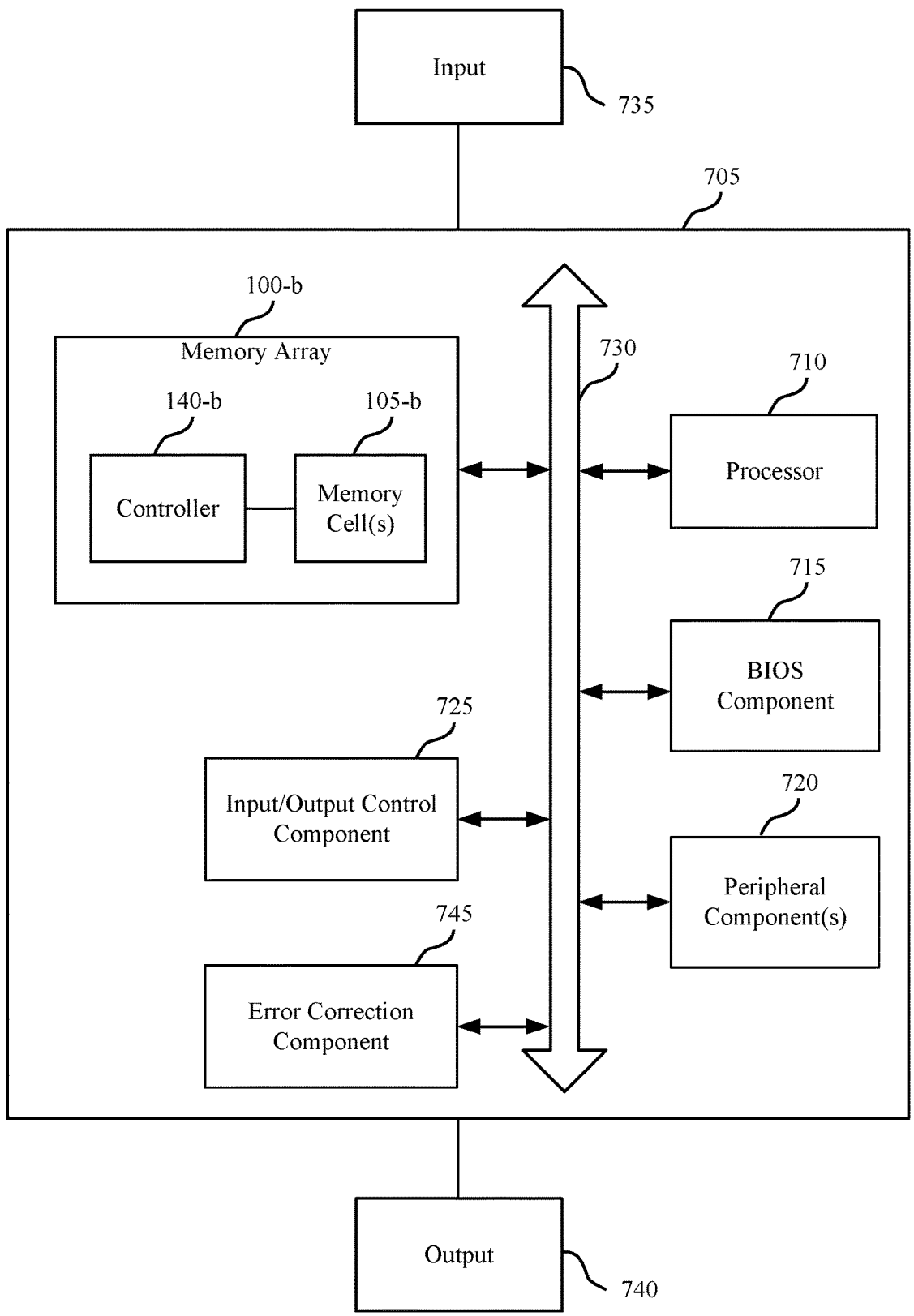
FIG. 7 illustrates a block diagram of devices that support an error correction bit flipping scheme in accordance with aspects of the present disclosure.

FIG. 7 illustrates a system that supports an error correction bit flipping scheme in accordance with various embodiments of the present disclosure. System 700 includes a device 705, which may be or include a printed circuit board to connect or physically support various components. Device 705 includes a memory array 100-*b*, which may be an example of memory array 100 described with reference to FIGS. 1 and 6. Memory array 100-*b* may contain memory controller 140-*b* and memory cell(s) 105-*b*, which may be examples of a memory controller 140 and memory cell(s) 105 as described with reference to FIGS. 1 and 6. Device 705 may also include a processor 710, BIOS component 715, peripheral component(s) 720, and input/output control component 725. The components of device 705 may be in electronic communication with one another through bus 730.

Processor 710 may be configured to operate memory array 100-*b* through memory controller 140-*b*. In some cases, processor 710 may perform the functions of memory controller 140 described with reference to FIGS. 1 and 6. In other cases, memory controller 140-*b* may be integrated into processor 710. Processor 710 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 710 may perform various functions described herein. Processor 710 may, for example, be configured to execute computer-readable instructions stored in memory array 100-*b* to cause device 705 perform various functions or tasks.

BIOS component 715 may be a software component that includes a basic input/output system (BIOS) operated as firmware, which may initialize and run various hardware components of system 700. BIOS component 715 may also manage data flow between processor 710 and the various components, e.g., peripheral components 720, input/output control component 725, etc. BIOS component 715 may include a program or software stored in read only memory (ROM), flash memory, or any other non-volatile memory.

Peripheral component(s) 720 may be any input or output device, or an interface for such devices, that is integrated into device 705. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output control component 725 may manage data communication between processor 710 and peripheral component(s) 720, input devices 735, or output devices 740. Input/output control component 725 may also manage peripherals not integrated into device 905. In some cases, input/output control component 725 may represent a physical connection or port to the external peripheral.

Input 735 may represent a device or signal external to device 705 that provides input to device 705 or its components. This may include a user interface or interface with or between other devices. In some cases, input 735 may be a peripheral that interfaces with device 705 via peripheral component(s) 720 or may be managed by input/output control component 725.

Output 740 may represent a device or signal external to device 705 configured to receive output from device 705 or any of its components. Examples of output 740 may include a display, audio speakers, a printing device, another processor or printed circuit board, etc. In some cases, output 740 may be a peripheral that interfaces with device 705 via peripheral component(s) 720 or may be managed by input/output control component 725.

Error correction component 745 may receive a flip bit, data bits, and/or parity bits from the memory array 100-*b*. In some examples, there may be corresponding error correction components for the data bits and the flip bit. There may be error correction components for one or more of the parity bits as well. Additionally, there may be a plurality of flip bits received at the error correction component, but in this example, a single flip bit will be discussed. The error correction component may error correct the received flip bit and data bits, for example, after a read command may be received at the memory array 100-*b*.

After error correcting the flip bit, the error corrected flip bit may be transmitted directly to a flip decision component (not shown in FIG. 7). The error correct flip bit may be transmitted on a dedicated, unidirectional, and/or read-only line to the flip decision component. Further, the error corrected data bits may also be transmitted to the flip decision component. The error corrected data bits may be transmitted on a different line than the error corrected flip bit and due to the slower speed of a read/write line, the error corrected data bits may arrive concurrently with or after the flip bit. After receiving the error corrected flip bit and error corrected data bits, the flip decision component may determine whether the error corrected data bits should be inverted or not.

The components of memory controller 140-*b*, device 705, and memory array 100-*b* may be made up of circuitry designed to carry out their functions. This may include various circuit elements, for example, conductive lines, transistors, capacitors, inductors, resistors, amplifiers, or other active or inactive elements, configured to carry out the functions described herein.

Figure 8:
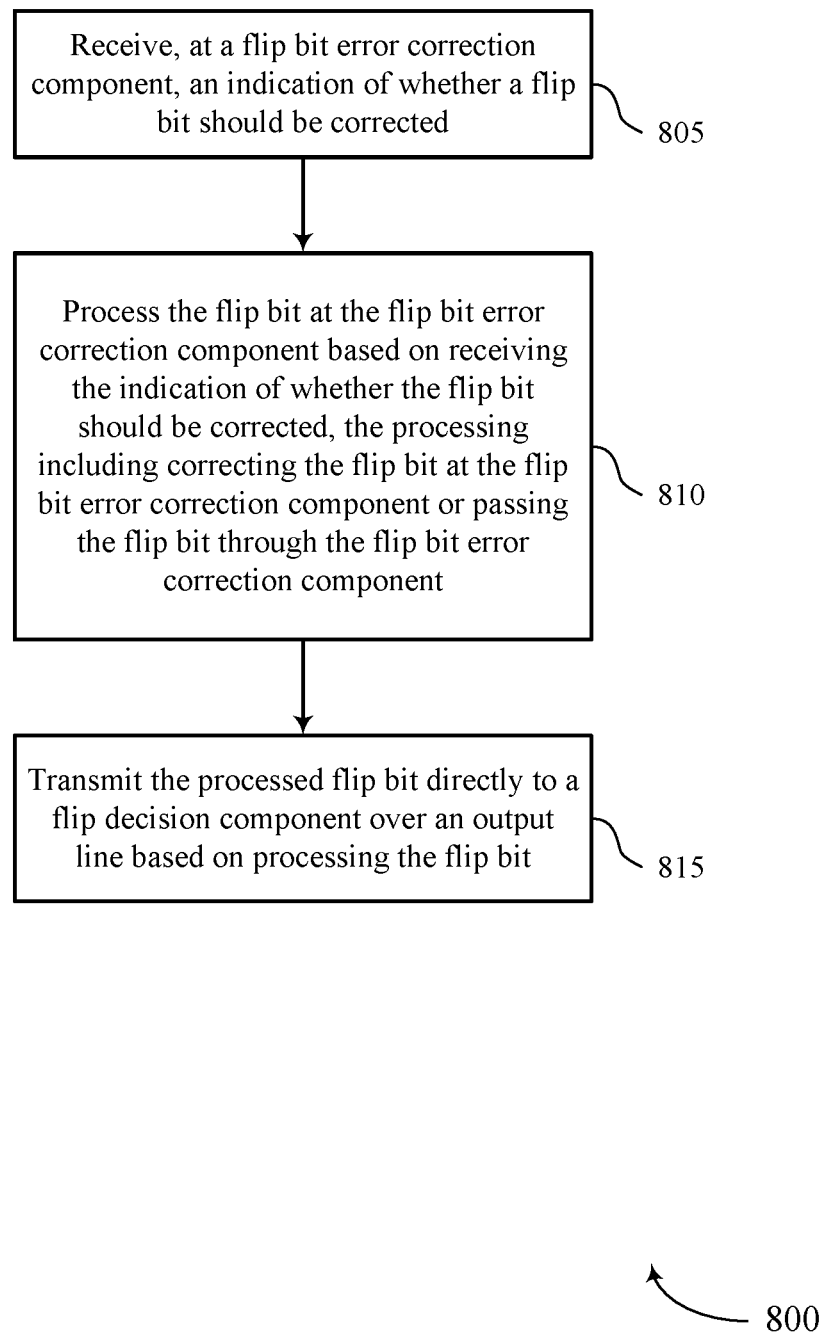
FIGS. 8 through 10 show flowcharts illustrating methods that support an error correction bit flipping scheme in accordance with aspects of the present disclosure.

FIG. 8 shows a flowchart illustrating a method 800 that supports an error correction bit flipping scheme in accordance with aspects of the present disclosure. The operations of method 800 may be implemented by a controller or its components as described herein, among other examples. For example, the operations of method 800 may be performed by a controller or a host device as described with reference to FIGS. 1 through 5. In some examples, a controller may execute a set of instructions to control the functional elements of the controller to perform the functions described herein. Additionally or alternatively, a controller may perform aspects of the functions described herein using special-purpose hardware.

At 805, a component may receive, at a flip bit error correction component, an indication of whether a flip bit should be corrected. The operations of 805 may be performed according to the methods described herein. In some examples, aspects of the operations of 805 may be performed by an error correction component as described with reference to FIGS. 1 through 5.

At 810, the component controller may process the flip bit at the flip bit error correction component based on receiving the indication of whether the flip bit should be corrected, the processing including correcting the flip bit at the flip bit error correction component or passing the flip bit through the flip bit error correction component. The operations of 810 may be performed according to the methods described herein. In some examples, aspects of the operations of 810 may be performed by an error correction component as described with reference to FIGS. 1 through 5.

At 815, the component may transmit the processed flip bit directly to a flip decision component over an output line based on processing the flip bit. The operations of 815 may be performed according to the methods described herein. In some examples, aspects of the operations of 815 may be performed by a flip decision component as described with reference to FIGS. 1 through 5.

An apparatus is described. The apparatus may include a processor, memory in electronic communication with the processor, and instructions stored in the memory. The instructions may be executable by the processor to cause the apparatus to receive, at a flip bit error correction component, an indication of whether a flip bit should be corrected, process the flip bit at the flip bit error correction component based on receiving the indication of whether the flip bit should be corrected, the processing including correcting the flip bit at the flip bit error correction component or passing the flip bit through the flip bit error correction component, and transmit the processed flip bit directly to a flip decision component over an output line based on processing the flip bit.

Another apparatus is described. The apparatus may include means for receiving, at a flip bit error correction component, an indication of whether a flip bit should be corrected, processing the flip bit at the flip bit error correction component based on receiving the indication of whether the flip bit should be corrected, the processing including correcting the flip bit at the flip bit error correction component or passing the flip bit through the flip bit error correction component, and transmitting the processed flip bit directly to a flip decision component over an output line based on processing the flip bit.

A non-transitory computer-readable medium for storing code is described. The code may include instructions executable by a processor to receive, at a flip bit error correction component, an indication of whether a flip bit should be corrected, process the flip bit at the flip bit error correction component based on receiving the indication of whether the flip bit should be corrected, the processing including correcting the flip bit at the flip bit error correction component or passing the flip bit through the flip bit error correction component, and transmit the processed flip bit directly to a flip decision component over an output line based on processing the flip bit.

In some examples of the method, apparatuses, and non-transitory computer-readable medium described herein, receiving the indication may include operations, features, means, or instructions for receiving an indication that the flip bit should be corrected, and where processing the flip bit includes correcting an error of the flip bit at the flip bit error correction component.

Some examples of the method, apparatuses, and non-transitory computer-readable medium described herein may further include operations, features, means, or instructions for transmitting a set of data bits to the flip decision component over a second output line based on processing the flip bit.

Some examples of the method, apparatuses, and non-transitory computer-readable medium described herein may further include operations, features, means, or instructions for transmitting a set of data bits to the flip decision component over a second output line based on transmitting the processed flip bit to the flip decision component.

In some examples of the method, apparatuses, and non-transitory computer-readable medium described herein may further include operations, features, means, or instructions for transmitting the set of data bits to the flip decision component over the second output line based on transmitting the processed flip bit directly to the flip decision component over the output line.

Some examples of the method, apparatuses, and non-transitory computer-readable medium described herein may further include operations, features, means, or instructions for receiving, at a data bit error correction component, a second indication of whether a data bit should be error corrected, correcting, the data bit at the data bit error correction component, based on receiving the second indication, and transmitting the corrected data bit to the flip decision component over a second output line.

Figure 9:
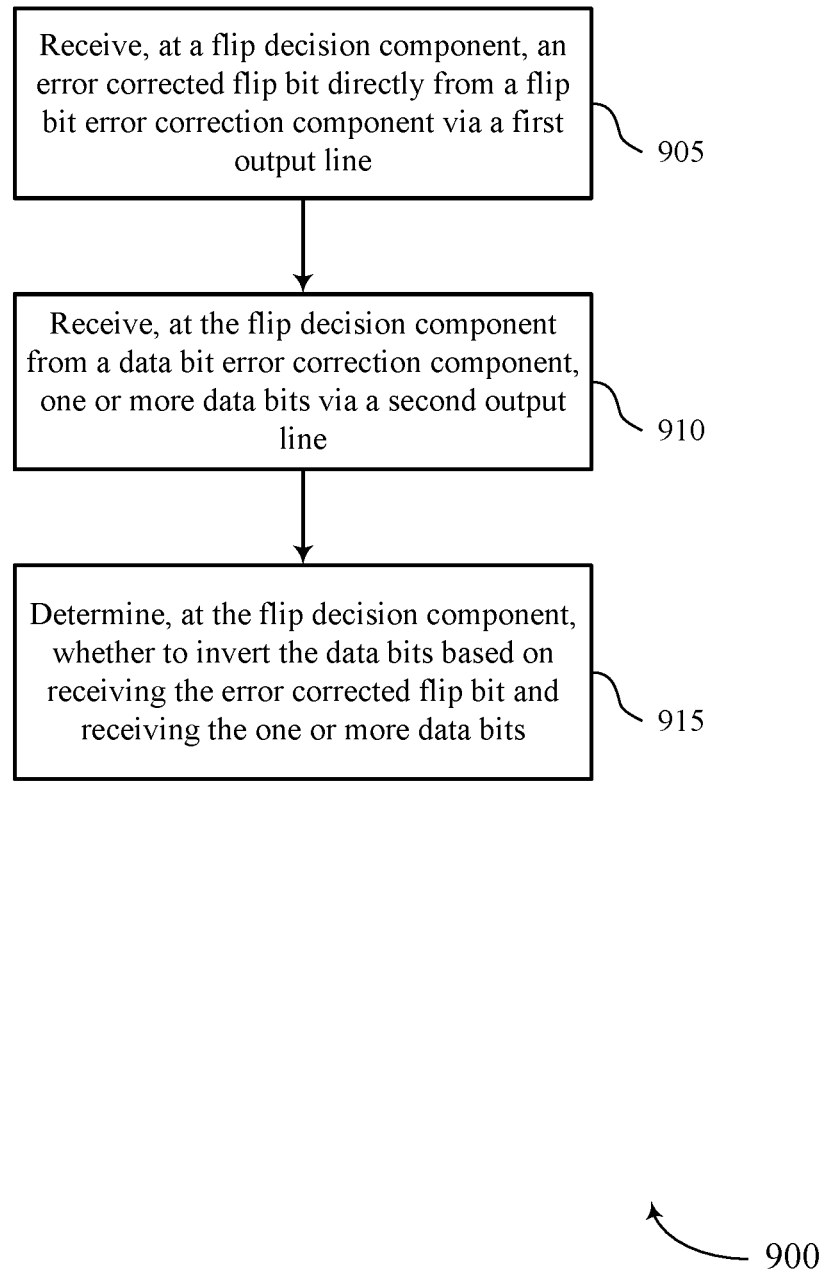

FIG. 9 shows a flowchart illustrating a method 900 that supports an error correction bit flipping scheme in accordance with aspects of the present disclosure. The operations of method 900 may be implemented by a controller or its components as described herein. For example, the operations of method 900 may be performed by a controller or host device as described with reference to FIGS. 1 through 5. In some examples, a controller may execute a set of instructions to control the functional elements of the controller to perform the functions described herein. Additionally or alternatively, a controller may perform aspects of the functions described herein using special-purpose hardware.

At 905, the component may receive, at a flip decision component, an error corrected flip bit directly from a flip bit error correction component via a first output line. The operations of 905 may be performed according to the methods described herein. In some examples, aspects of the operations of 905 may be performed by a flip decision component as described with reference to FIGS. 1 through 5.

At 910, the component may receive, at the flip decision component from a data bit error correction component, one or more data bits via a second output line. The operations of 910 may be performed according to the methods described herein. In some examples, aspects of the operations of 910 may be performed by a flip decision component as described with reference to FIGS. 1 through 5.

At 915, the component may determine, at the flip decision component, whether to invert the data bits based on receiving the error corrected flip bit and receiving the one or more data bits. The operations of 915 may be performed according to the methods described herein. In some examples, aspects of the operations of 915 may be performed by a flip decision component as described with reference to FIGS. 1 through 5.

An apparatus is described. The apparatus may include a processor, memory in electronic communication with the processor, and instructions stored in the memory. The instructions may be executable by the processor to cause the apparatus to receive, at a flip decision component, an error corrected flip bit directly from a flip bit error correction component via a first output line, receive, at the flip decision component from a data bit error correction component, one or more data bits via a second output line, and determine, at the flip decision component, whether to invert the data bits based on receiving the error corrected flip bit and receiving the one or more data bits.

Another apparatus is described. The apparatus may include means for receiving, at a flip decision component, an error corrected flip bit directly from a flip bit error correction component via a first output line, means for receiving, at the flip decision component from a data bit error correction component, one or more data bits via a second output line, and means for determining, at the flip decision component, whether to invert the data bits based on receiving the error corrected flip bit and receiving the one or more data bits.

A non-transitory computer-readable medium for storing code is described. The code may include instructions executable by a processor to receive, at a flip decision component, an error corrected flip bit directly from a flip bit error correction component via a first output line, receive, at the flip decision component from a data bit error correction component, one or more data bits via a second output line, and determine, at the flip decision component, whether to invert the data bits based on receiving the error corrected flip bit and receiving the one or more data bits.

In some examples of the method, apparatuses, and non-transitory computer-readable medium described herein, receiving the one or more data bits via the second output line may include operations, features, means, or instructions for receiving at least some of the one or more data bits after receiving the flip bit.

Figure 10:
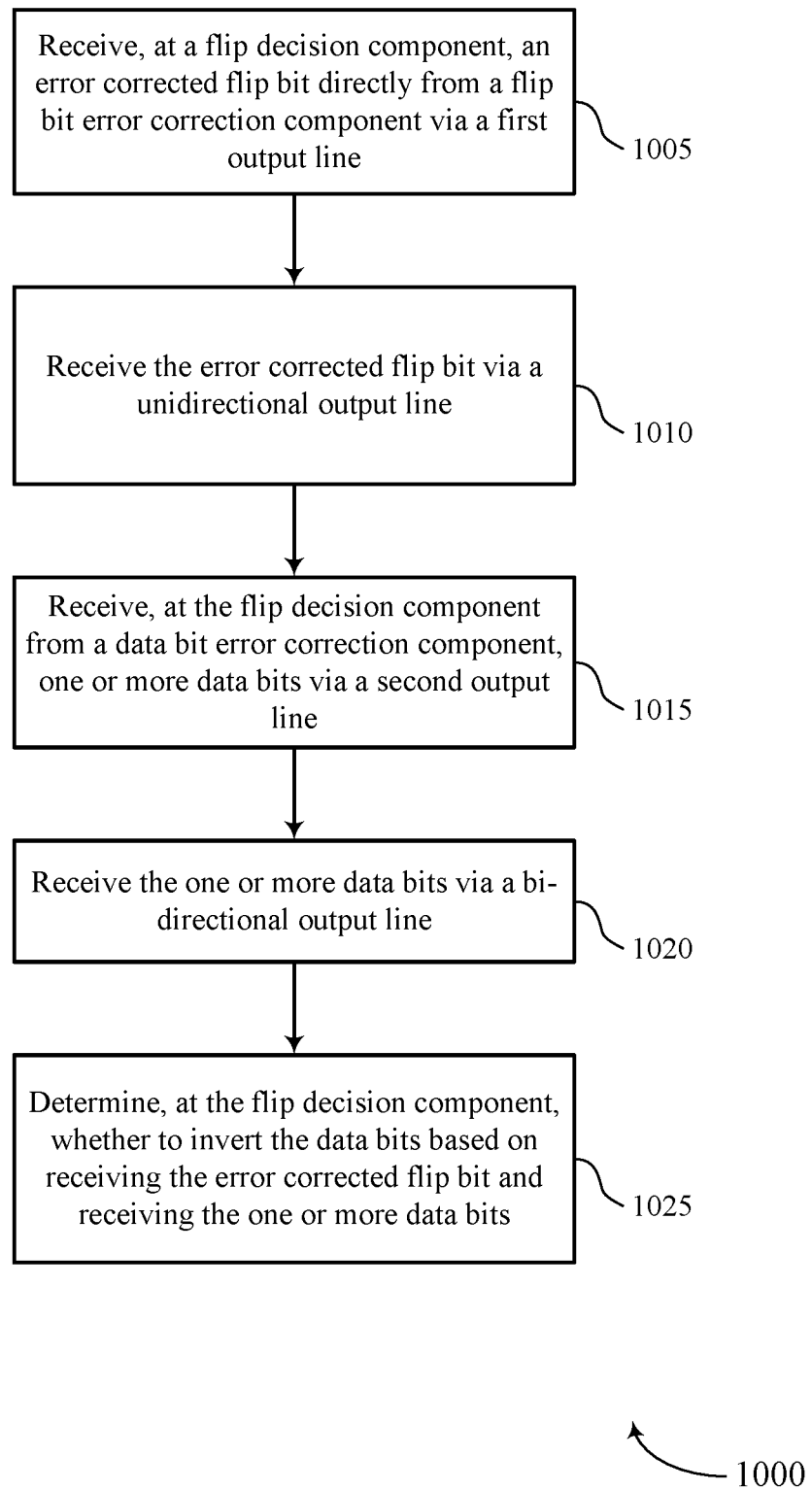

FIG. 10 shows a flowchart illustrating a method 1000 that supports an error correction bit flipping scheme in accordance with aspects of the present disclosure. The operations of method 1000 may be implemented by a controller or its components as described herein. For example, the operations of method 1000 may be performed by a controller or host device as described with reference to FIGS. 1 through 5. In some examples, a controller may execute a set of instructions to control the functional elements of the controller to perform the functions described herein. Additionally or alternatively, a controller may perform aspects of the functions described herein using special-purpose hardware.

At 1005, the component may receive, at a flip decision component, an error corrected flip bit directly from a flip bit error correction component via a first output line. The operations of 1005 may be performed according to the methods described herein. In some examples, aspects of the operations of 1005 may be performed by a flip decision component as described with reference to FIGS. reference to FIGS. 1 through 5.

At 1010, the component may receive the error corrected flip bit via a unidirectional output line. The operations of 1010 may be performed according to the methods described herein. In some examples, aspects of the operations of 1010 may be performed by a flip decision component as described with reference to FIGS. 1 through 5.

At 1015, the component may receive, at the flip decision component from a data bit error correction component, one or more data bits via a second output line. The operations of 1015 may be performed according to the methods described herein. In some examples, aspects of the operations of 1015 may be performed by a flip decision component as described with reference to FIGS. 1 through 5.

At 1020, the component may receive the one or more data bits via a bi-directional output line. The operations of 1020 may be performed according to the methods described herein. In some examples, aspects of the operations of 1020 may be performed by a flip decision component as described with reference to FIGS. 1 through 5.

At 1025, the component may determine, at the flip decision component, whether to invert the data bits based on receiving the error corrected flip bit and receiving the one or more data bits. The operations of 1025 may be performed according to the methods described herein. In some examples, aspects of the operations of 1025 may be performed by a flip decision component as described with reference to FIGS. 1 through 5.

In some examples of the method, apparatuses, and non-transitory computer-readable medium described herein may further include operations, features, means, or instructions for receiving the error corrected flip bit via a unidirectional output line, and where receiving the one or more data bits via the second output line includes, and receiving the one or more data bits via a bi-directional output line.

In some examples of the method, apparatuses, and non-transitory computer-readable medium described herein, receiving the error corrected flip bit and receiving the one or more data bits may include operations, features, means, or instructions for concurrently receiving the flip bit and at least some of the one or more data bits.

Some examples of the method, apparatuses, and non-transitory computer-readable medium described herein may further include operations, features, means, or instructions for determining, at the flip decision component, an output value using a configured logic criterion based on receiving the one or more data bits and the error corrected flip bit, and transmitting an indicator of the output value to a data bus decision component.

Some examples of the method, apparatuses, and non-transitory computer-readable medium described herein may further include operations, features, means, or instructions for transmitting a second indicator, from the flip decision component, of whether the data bits were inverted based on the output value and the error corrected flip bit.

In some examples of the method, apparatuses, and non-transitory computer-readable medium described herein, determining, at the flip decision component, the output value using the configured logic criterion may include operations, features, means, or instructions for comparing the received data bits to the configured logic criterion to determine whether a number of logic states of the received data bits of a first type may be greater than a threshold.

In some examples of the method, apparatuses, and non-transitory computer-readable medium described herein, determining, at the flip decision component, the output value using the configured logic criterion may include operations, features, means, or instructions for comparing at least some of the one or more data bits and the error corrected flip bit using a logic component that includes an exclusive or (XOR) component.

Some examples of the method, apparatuses, and non-transitory computer-readable medium described herein may further include operations, features, means, or instructions for inverting, at the flip decision component, the data bits based on determining whether to invert the data bits, and outputting the inverted data bits.

It should be noted that the methods described herein describe possible implementations, and that the operations and the steps may be rearranged or otherwise modified and that other implementations are possible. Furthermore, aspects from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" used herein refers to a stratum or sheet of a geometrical structure. each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (e.g., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:
1. An apparatus, comprising:
a flip decision component;
flip bit error correction component coupled with the flip decision component;
a data bit error correction component configured to perform a bit error correction procedure; and
a controller configured to cause the apparatus to:
receive, at the flip decision component, an error corrected flip bit from the flip bit error correction component via a first output line;
receive, at the flip decision component, one or more data bits from the data bit error correction component via a second output line; and
determine, at the flip decision component, whether to invert the one or more data bits based at least in part on receiving the error corrected flip bit and receiving the one or more data bits.
2. The apparatus of claim 1, wherein, to receive the one or more data bits via the second output line, the controller is configured to cause the apparatus to:
receive at least some of the one or more data bits after the error corrected flip bit is received.
3. The apparatus of claim 1, wherein, to receive the error corrected flip bit via the first output line, the controller is configured to cause the apparatus to:
receive the error corrected flip bit via a unidirectional output line, and wherein, to support receiving the one or more data bits via the second output line, the controller is configured to:
receive the one or more data bits via a bi-directional output line.
4. The apparatus of claim 1, wherein the apparatus is configured to receive the error corrected flip bit and at least some of the one or more data bits concurrently.
5. The apparatus of claim 1, wherein the controller is further configured to cause the apparatus to:

determine, at the flip decision component, an output value using a configured logic criterion based at least in part on the one or more data bits and the error corrected flip bit; and transmit an indicator of the output value to a data bus decision component.

6. The apparatus of claim 5, wherein the controller is further configured to cause the apparatus to:

transmit a second indicator of whether the one or more data bits were inverted based at least in part on the output value and the error corrected flip bit.

7. The apparatus of claim 5, wherein, to determine the output value, the controller is configured to cause the apparatus to:

compare the one or more data bits to the configured logic criterion to determine whether a number of logic states of the one or more data bits of a first type are greater than a threshold.

8. The apparatus of claim 7, wherein, to determine the output value, the controller is configured to cause the apparatus to:

compare at least some of the one or more data bits and the error corrected flip bit using a logic component that comprises an exclusive or (XOR) component.

9. A method, comprising:

transmitting, by a flip bit error correction component, one or more flip bits to a flip decision component over a first output line coupling the flip bit error correction component and the flip decision component;

performing, by a data bit error correction component, a bit error correction procedure on one or more data bits; and transmitting, by the data bit error correction component, the one or more data bits to the flip decision component over a second output line based at least in part on performing the bit error correction procedure.

10. The method of claim 9, further comprising:

determining, by the flip decision component, whether the one or more data bits should be inverted based at least in part on at least one of the one or more data bits received over the second output line or the one or more flip bits received over the first output line.

11. The method of claim 9, wherein the data bit error correction component is directly coupled with the flip decision component over the second output line.

12. The method of claim 9, further comprising:

receiving, from a decoder by the data bit error correction component, an indication of whether to correct the one or more data bits; and transmitting, in response to receiving the indication, the one or more data bits over the second output line.

13. The method of claim 9, further comprising:

receiving, from a decoder by the flip bit error correction component, an indication of whether to correct the one or more flip bits; and transmitting, in response to receiving the indication, the one or more flip bits over the first output line.

14. The method of claim 12, wherein the flip decision component receives the one or more data bits and the one or more flip bits simultaneously.

15. The method of claim 9, further comprising:

outputting, by the flip decision component, a data bit inversion decision indicating whether to invert the one or more data bits based at least in part on logic criterion stored at the flip decision component; and receiving, by a data bus decision component, the data bit inversion decision from the flip decision component.

16. The method of claim 15, further comprising:

comparing, by the flip decision component, the one or more data bits to the logic criterion to determine that a number of logic states of the one or more data bits of a first type satisfies a threshold, wherein the data bit inversion decision indicates that the number of logic states satisfies the threshold.

17. The method of claim 15, wherein the first output line has a first transmission speed and the second output line has a second transmission speed that is slower than the first transmission speed.

18. An apparatus, comprising:

a flip decision component;

a flip bit error correction component coupled with the flip decision component via a first output line;

a data bit error correction component; and a controller configured to cause the apparatus to:

transmit, by the flip bit error correction component, one or more flip bits to the flip decision component via the first output line;

perform, by the data bit error correction component, a bit error correction procedure on one or more data bits; and transmit, by the data bit error correction component, the one or more data bits to the flip decision component via a second output line based at least in part on performing the bit error correction procedure.

19. The apparatus of claim 18, wherein the controller is further configured to cause the apparatus to:

determine, by the flip decision component, whether the one or more data bits should be inverted based at least in part on at least one of the one or more data bits received over the second output line or the one or more flip bits received over the first output line.

20. The apparatus of claim 18, wherein the data bit error correction component is directly coupled with the flip decision component over the second output line.

* * * * *